United States Patent
Kofuji

(10) Patent No.: US 7,371,692 B2
(45) Date of Patent: May 13, 2008

(54) METHOD FOR MANUFACTURING A SEMICONDUCTOR DEVICE HAVING A W/WN/POLYSILICON LAYERED FILM

(75) Inventor: Naoyuki Kofuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 382 days.

(21) Appl. No.: 11/099,609

(22) Filed: Apr. 6, 2005

(65) Prior Publication Data
US 2005/0227470 A1 Oct. 13, 2005

(30) Foreign Application Priority Data
Apr. 7, 2004 (JP) .............................. 2004-113450

(51) Int. Cl.
*H01L 21/302* (2006.01)
*H01L 21/461* (2006.01)
(52) U.S. Cl. ............................... 438/738; 257/E21.218
(58) Field of Classification Search ................. 438/8, 438/9
See application file for complete search history.

(56) References Cited

U.S. PATENT DOCUMENTS

| | | | |
|---|---|---|---|
| 5,753,533 A | 5/1998 | Saito | |
| 6,068,783 A * | 5/2000 | Szetsen | 216/60 |
| 6,440,870 B1 * | 8/2002 | Nallan et al. | 438/734 |
| 6,613,682 B1 * | 9/2003 | Jain et al. | 438/706 |
| 6,716,760 B2 | 4/2004 | Bae et al. | |
| 7,048,837 B2 * | 5/2006 | Somekh et al. | 204/192.13 |
| 2003/0092280 A1 * | 5/2003 | Lee et al. | 438/720 |

FOREIGN PATENT DOCUMENTS

| | | |
|---|---|---|
| JP | 2-2618 | 1/1990 |
| JP | 2-302034 | 12/1990 |
| JP | 6-244150 | 9/1994 |
| JP | 7-147271 | 6/1995 |
| JP | 10-247641 | 9/1998 |
| JP | 2000-040696 | 2/2000 |
| JP | 2003-17475 | 1/2003 |
| JP | 2003-068878 | 3/2003 |
| JP | 2003-078034 | 3/2003 |

OTHER PUBLICATIONS

Chinese Office Action dated Feb. 1, 2008, with English language translation.

\* cited by examiner

*Primary Examiner*—B. William Baumeister
*Assistant Examiner*—Bryan E Wilson
(74) *Attorney, Agent, or Firm*—McGinn IP Law Group, PLLC

(57) ABSTRACT

A method for manufacturing a semiconductor device includes the steps of consecutively depositing a Poly-Si layer, a WN layer and a W layer on a $SiO_2$ layer, forming a mask pattern on the W layer, selectively etching the W layer by using plasma in a first etching gas having a high etch selectivity ratio between W and WN, selectively etching the WN layer and the Poly-Si layer by using plasma in a second etching gas having a high etch selectivity between WN and Si, and selectively etching the Poly-Si layer 13 by using plasma in a third etching gas having a high etch selectivity between Si and silicon oxide.

16 Claims, 9 Drawing Sheets

METHOD FOR MANUFACTURING A SEMICONDUCTOR DEVICE HAVING A W/WN/POLYSILICON LAYERED FILM

BACKGROUND OF THE INVENTION

1. Field of the Invention

The present invention relates to a method for manufacturing a semiconductor device and, more particularly, to a technology for forming a pattern on a W/WN/polysilicon layered film structure by using a dry etching technique.

2. Description of the Related Art

Gate electrodes are designed to have a lower wiring resistance and a smaller thickness to match the request for a higher integration density and a higher performance of semiconductor integrated circuits. As a gate electrode structure for realizing the lower wiring resistance and the smaller film thickness, there is known a polysilicon-metal structure in which a high-melting-point metal layer is stacked on a Poly-Si (polysilicon:polycrystalline silicon) layer. A polysilicon-metal gate electrode structure having a W/WN/Poly-Si/$SiO_2$ layered film has been developed, in which the $SiO_2$ film is used for a gate insulating film underlying the gate electrode structure, the W layer is used as a high-melting-point metal film, and the WN layer is interposed as a barrier metal film between the W layer and the Poly-Si layer.

The gate electrode structure having the W/WN/Poly-Si/$SiO_2$ layered film, as shown in FIG. 3, is manufactured by forming a mask 23 made of an insulating film on the W/WN/Poly-Si/$SiO_2$ layered film 10 and patterning the layered film 10 by using a dry etching technique. Such a method for manufacturing the gate electrode is described in, for example, Jpn. Pat. Appln. Publication Nos. 2000-40696 and 2003-78034.

In the above patent documents, the dry etching technique is used as a first step wherein metal layers, such as the W layer 15 and WN layer 14, are etched by using plasma generated in mixed gas containing $SF_6$. Thereafter, in a second step, the Poly-Si layer 13 is etched by using plasma generated in mixed gas containing $Cl_2$ and Ar. Subsequently, in a third step, residues of the Poly-Si layer 13 are etched while maintaining a high selectivity ratio of the Poly-Si layer 13 from the $SiO_2$ layer 12 by using plasma generated in mixed gas containing HBr and $O_2$.

In a DRAM (Dynamic Random Access Memory) having a gate width of 110 nm for a next generation, the thickness of the layered film is extremely reduced in order to raise the operational speed of the semiconductor device, wherein the design thickness of the Poly-Si layer 13 is 70 nm or less, and the design thickness of the gate oxide film made of $SiO_2$ is 4 nm or less, for example. For using the manufacturing methods described in the above patent documents in the semiconductor device having such a gate electrode structure, there occurs a problem of so-called "penetration of $SiO_2$ layer" wherein the $SiO_2$ layer is broken by penetration during the etching process in the second or third step. Although the problem of penetration of the $SiO_2$ layer is also described in the above patent documents, it is difficult to effectively suppress the penetration of the $SiO_2$ layer in the process of manufacturing the gate electrode structure having the above-described thin $SiO_2$ layer 12 and Poly-Si layer 13.

SUMMARY OF THE INVENTION

In view of the above problem in the conventional technique, it is an object of the present invention to provide a method for manufacturing a semiconductor device which prevents the penetration of a $SiO_2$ layer in the process for forming a pattern of a gate electrode structure having, for example, a W/WN/Poly-Si/$SiO_2$ layered film by using a dry etching technique.

The present invention provides a method for manufacturing a semiconductor device including the steps of: consecutively depositing a silicon (Si) layer, a tungsten nitride (WN) layer, and a tungsten (W) layer on a silicon oxide layer; forming a mask pattern on the W layer; selectively etching the W layer by using plasma generated in a first etching gas having a high W/WN etch selectivity ratio and using the mask pattern as an etching mask; selectively etching the WN layer and Si layer by using plasma generated in a second etching gas having a high WN/Si etch selectivity ratio and using the mask pattern as an etching mask; and selectively etching the Si layer by using plasma generated in a third etching gas having a high Si/SiO2 etch selectivity ratio and using the mask pattern as an etching mask.

According to the present invention, and etching depth difference caused by coarse and fine regions and the resultant unevenness of the etched surface in the silicon surface can be reduced in the vicinity of the boundary between the W layer and the WN layer by selectively etching the W layer by using plasma generated in a first etching gas having a high etch selectivity between W and WN. Further, since the etching is not abruptly advanced in the penetrated part of the WN layer during selectively etching the WN layer and Si layer by using the plasma generated in the second etching gas having a high etch selectivity between WN and Si, penetration of the silicon oxide layer can be prevented without enlarging the etching depth difference caused by coarse and fine pattern regions and the resultant unevenness on the etched surface.

The present invention can be applied to, for example, formation of gate electrode and interconnection patterns. In the present invention, the Si layer is typically a Poly-Si layer. In this case, the Si layer configures a gate electrode or interconnection structure in a polysilicon-metal layered film structure together with the underlying W layer and WN layer. If the present invention is applied to the manufacture of a semiconductor device in which the thickness of the Si layer is 70 nm or less and the thickness of the silicon oxide layer is 4 nm or less, effective suppression of penetration of the silicon oxide film can be obtained. The silicon oxide film is typically a $SiO_2$ layer.

DETAILED DESCRIPTION OF THE PREFERRED EMBODIMENTS

Figure 4A:
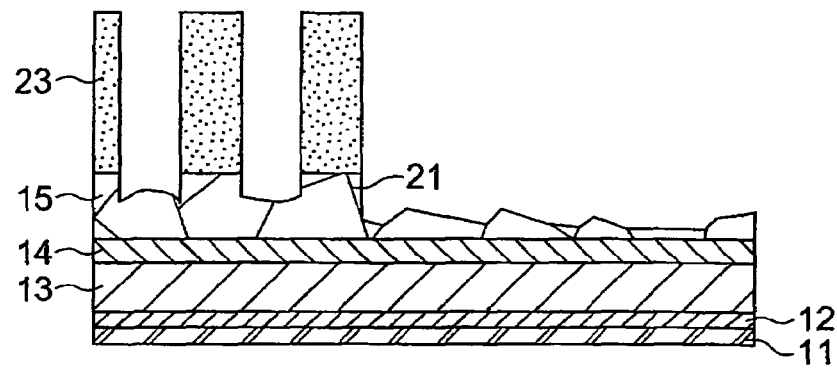
FIGS. 4A to 4C are sectional views showing manufacturing steps following to FIG. 3 of the conventional method.
Figure 4B:
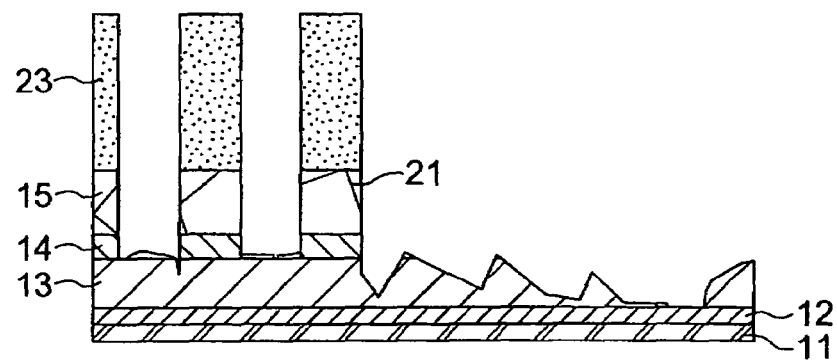
Figure 4C:
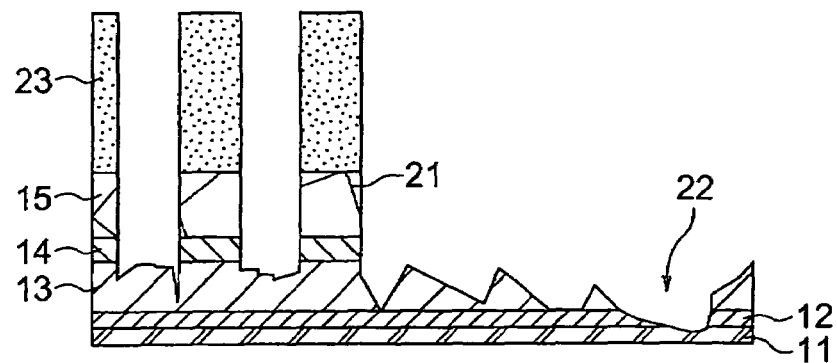

Before describing preferred embodiments of the present invention, the principle of the present invention will be described for a better understanding of the present invention. According to inventor's study, it has been discovered that penetration of the $SiO_2$ film occurs due to the steps described hereinafter. FIGS. 4A to 4C show sectional views of the semiconductor device in consecutive steps causing penetration of the $SiO_2$ layer when a W/WN/Poly-Si/$SiO_2$ layered film is etched by using the manufacturing method described in the patent documents as described before. As shown in the first step of FIG. 4A, since the etching speed is lower in a region (fine-pattern region) of the left side of the drawing having a higher pattern density compared to the etching speed in a region (coarse-pattern region) of the right side of the drawing having a lower pattern density, so-called "etching depth difference due to coarse and fine regions of the pattern density" arises because the etching depth of the fine-pattern region is smaller compared to the coarse-pattern region. The W layer 15 has a therein large grain boundary 21, and the vicinity of the grain boundary 21 is easily etched compared to the other region, whereby a large unevenness is generated on the surface of the W layer 15.

In the first step, when etching is performed until the desired portion of the WN layer 14 is substantially entirely removed, as shown in FIG. 4B, a portion of the Poly-Si layer 13 where the WN layer 14 is removed earlier is etched in a larger amount compared to the other region. Thus, the etching depth difference due to coarse and fine pattern regions is enlarged, and a large unevenness is generated on the surface of the Poly-Si layer 13. This is because the etching speed of the Poly-Si layer 13 by the $SF_6$ gas is higher than the etching speed of the W layer 15 and WN layer 14 by the $SF_6$ gas.

In the second step, etching is advanced while the etching depth difference due to coarse and fine pattern regions and the thus-generated unevenness remain substantially without any change thereof on the surface of the Poly-Si layer 13. Accordingly, as shown in FIG. 4C, a problem of penetration of the $SiO_2$ layer 12 arises in a recessed part 22 of the Poly-Si layer 13 in the coarse-pattern region where it is most deeply etched.

The present inventor has considered that the suppression of the etching depth difference and unevenness due to coarse and fine pattern regions on the etched surface are indispensable before the etching reaches the $SiO_2$ layer to prevent penetration of the $SiO_2$ layer 12. Prior to accomplishment of the present invention, experiments-1 to -3 to be described hereinafter were performed. In the experiment-1, in the etching using plasma generated in mixed gas of $SF_6$ and $N_2$, the relationship between the concentration of $N_2$ in the mixed gas and the W/WN selectivity ratio was examined.

Figure 5:
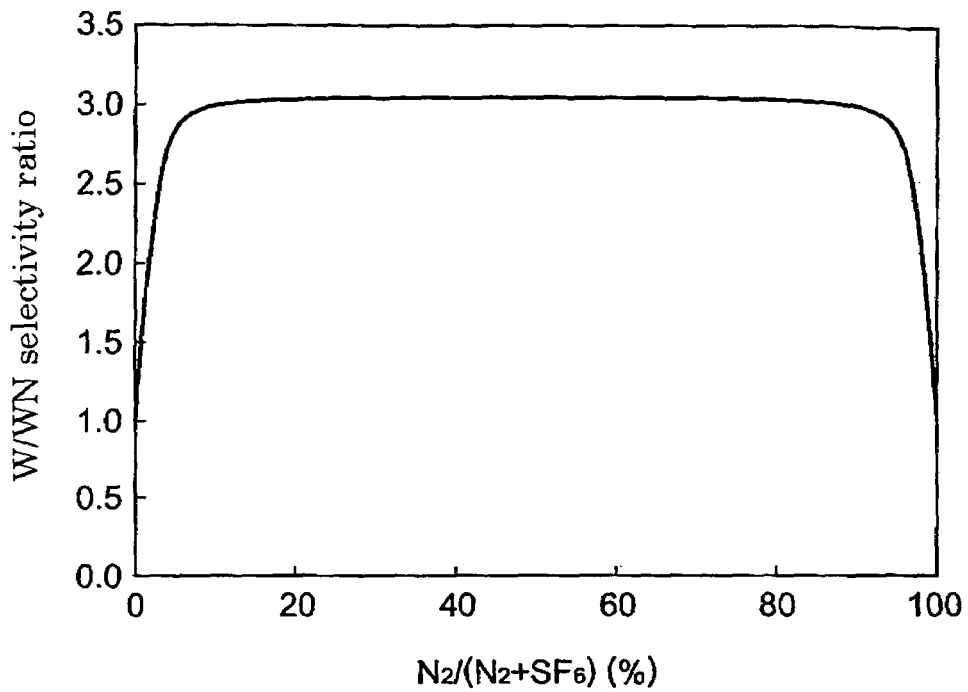
FIG. 5 is a graph showing the relationship between the W/WN etch selectivity ratio and the $N_2/(N_2+SF_6)$ mixture ratio.

The result is shown in FIG. 5. For the content ratio of $N_2$ at 0%, the selectivity ratio between W and WN (W/WN selectivity ratio) was approximately "1", i.e., there was substantially no W/WN etch selectivity. By adding $N_2$, the W/WN selectivity ratio is raised, and when the content ratio of $N_2$ was between 10% and 90%, a maximum value of "3" for the W/WN selectivity ratio was obtained. When the content ratio of $N_2$ exceeded 90%, the W/WN selectivity was lowered, and when the content ratio of $N_2$ was 100%, the W/WN selectivity ratio was lowered down to substantially "1", as shown in FIG. 5.

Figure 6:
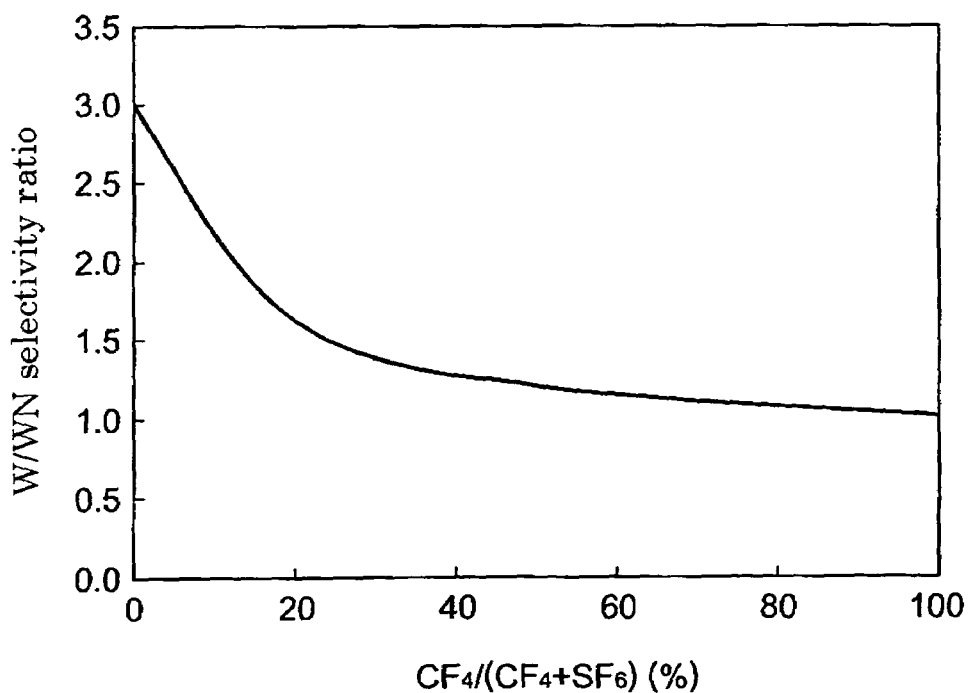
FIG. 6 is a graph showing the relationship between the W/WN etch selectivity ratio and the $CF_4/(CF_4+SF_6)$ mixture ratio in mixed gas mixed at a ratio of $(CF_4+SF_6):N_2=1:4$.

In the experiment-2, where plasma generated in mixed gas obtained by mixing $SF_6$, $CF_4$ and $N_2$, at a ratio of $(SF_6+CF_4):N_2=1:4$ was used as an etching gas, the relation between the $CF_4/(SF_6+CF_4)$ mixture ratio and the W/WN selectivity ratio was examined. The result is shown in FIG. 6. The W/WN selectivity ratio was monotonically lowered by adding the $CF_4$, and when the $CF_4$ was 100%, the W/WN selectivity ratio was lowered down to "1".

From the results of experiments-1 and -2, it has been understood that the high W/WN selectivity ratio can be realized by use of plasma in mixed gas containing $SF_6$ and $N_2$ and not containing $CF_4$. With further discussions and experiments, it has been discovered that even by using $NF_3$ instead of $SF_6$, similar results are obtained. Further, even by using other fluorocarbon gases, such as $CHF_3$, $CH_2F_2$, $CH_3F$, $C_2F_6$, $C_3F_6$, $C_4F_6$ and $C_4F_8$, instead of $CF_4$, similar results are obtained. Therefore, it has been concluded that a higher W/WN selectivity ratio is obtained by using plasma in mixed gas (first etching gas) which contains any of $SF_6$ and $NF_3$ and at least $N_2$ and which does not contain fluorocarbon gas.

Figure 7:
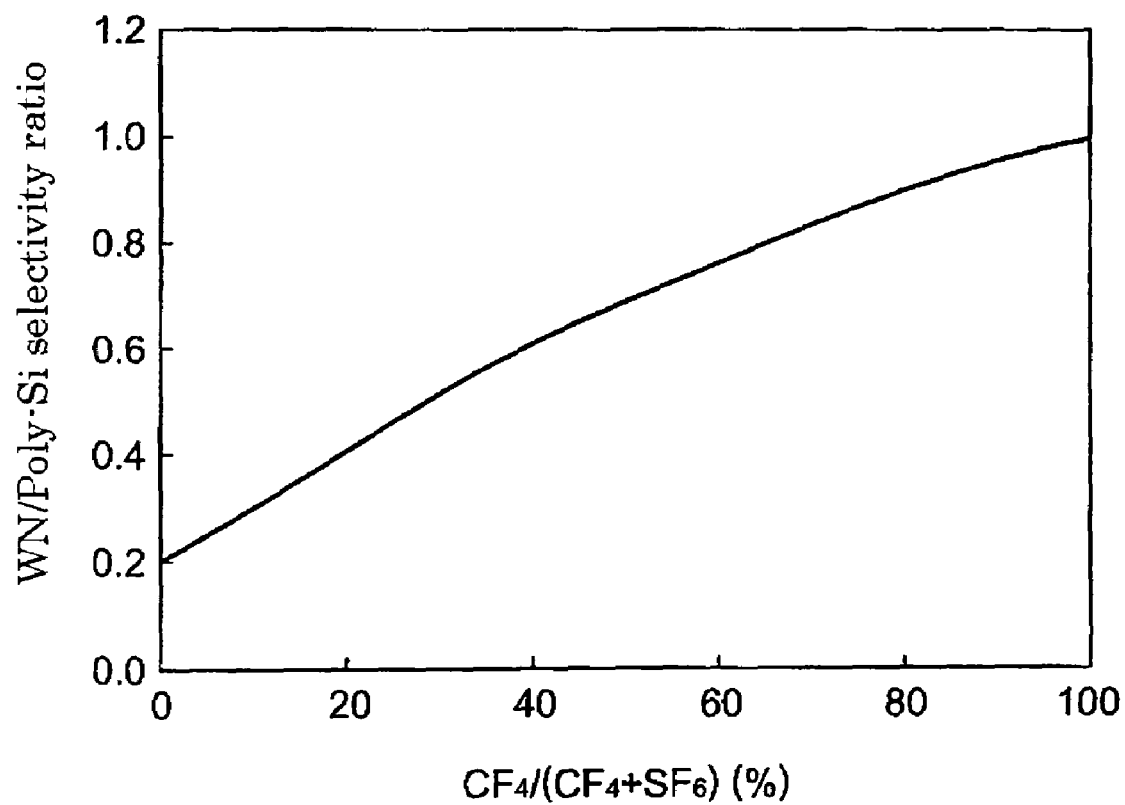
FIG. 7 is a graph showing the relationship between the WN/Poly-Si etch selectivity ratio and the $CF_4/(CF_4+SF_6)$ mixture ratio.

In the experiment-3, wherein plasma in mixed gas of $CF_4$ and $SF_6$ is used as an etching gas, the relationship between the concentration of $CF_4$ in mixed gas and the W/Poly-Si selectivity ratio was examined. The result is shown in FIG. 7. When $SF_6$ was 100%, the selectivity ratio was 0.2. However, as the concentration of $CF_4$ was increased, the selectivity ratio increased, and when $CF_4$ was 100%, the selectivity ratio was "1". Thus, it can be understood that when the plasma in mixed gas containing the $CF_4$ is used, the WN/Poly-Si selectivity can be improved. With the further discussions, even by using other fluorocarbon gases, such as $CHF_3$, $CH_2F_2$, $CH_3F$, $C_2F_6$, $C_3F_6$, $C_4F_6$ and $C_4F_8$, instead of CF4, similar results were obtained. Therefore, it has been concluded that a high WN/Poly-Si selectivity ratio is obtained by using plasma in mixed gas (second etching gas) containing the fluorocarbon gas.

Figure 8A:
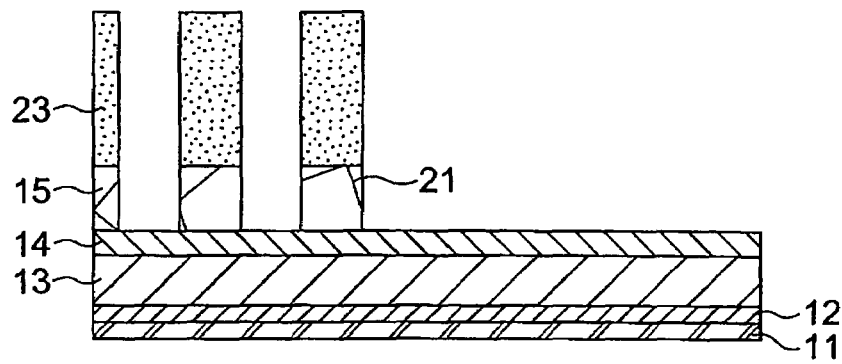
FIGS. 8A to 8C are sectional views showing consecutive steps of a method for manufacturing a semiconductor device according to a third embodiment of the present invention.

The present inventor has decided to perform the etching of the W/WN/Poly-Si/$SiO_2$ layered film based on the knowledge of the above-described experiments-1 to -3. In the first step, the W layer 15 is etched by using plasma generated in first etching gas that provides a high W/WN selectivity ratio. By using the first etching gas, even when there are the etching depth difference due to coarse and fine pattern regions and the unevenness on the surface of the W layer 15 as shown in FIG. 4A at the initial stage of the first step, the etching can be stopped in the vicinity of the W/WN boundary by the high W/WN selectivity ratio. Therefore, after the end of the first step, the etching depth difference due to coarse and fine pattern regions and the unevenness of the etching surface can be reduced as shown in FIG. 8A.

Figure 8B:
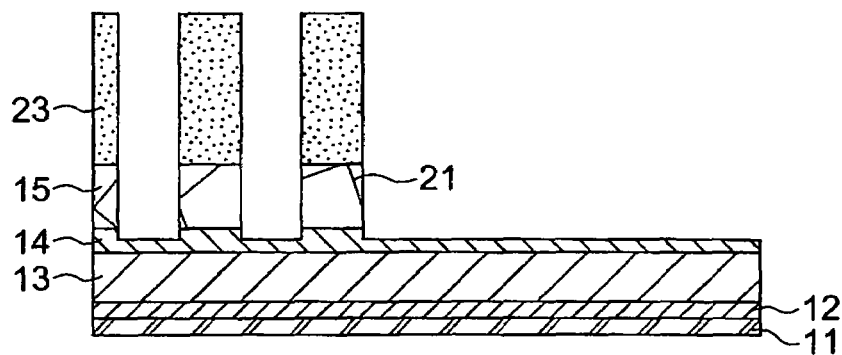
Figure 8C:
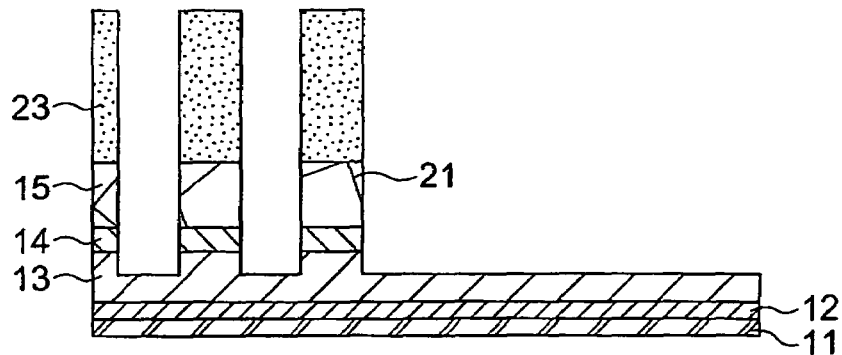

In the second step, the WN layer 14 and the Poly-Si layer 13 are etched by using plasma in the second etching gas that provides a high WN/Poly-Si selectivity ratio. In the second step, since the thickness of the WN layer 14 is as small as about 10 nm, the etching depth difference due to coarse and fine pattern regions of the WN layer 14 generated by etching the WN layer 14, as shown in FIG. 8B, is 10 nm or less. Also, even when the coarse pattern region or the recessed part of the WN layer 14 is penetrated, the Poly-Si layer 13 is not abruptly etched due to the high WN/Poly-Si selectivity ratio. Accordingly, the etching depth difference due to coarse and fine pattern regions and the unevenness of the etching surface are not enlarged. The suppression of the etching depth difference due to coarse and fine pattern regions and the unevenness of the etching surface on the Poly-Si layer 13 effectively suppresses penetration of the $SiO_2$ layer 12.

For shifting or switching from the first step to the second step, it is desirable to suitably determine the timing between the removal of the W layer 15 in the first step and the start for etching of the WN layer 14 in the second step. Thus, the present inventor performed the following experiment-4 to discuss the technique for determining the timing for the switching.

In the experiment-4, the layers from the W layer 15 to the upper part of the Poly-Si layer 13 in the W/WN/Poly-Si/ $SiO_2$ layered film were etched by using plasma in mixed gas of $SF_6$ and $N_2$. When the etching was performed, the relationship between the intensity of luminescence (Si luminescence) caused by Si atom as well as the intensity (W luminescence) caused by a reaction product of W and the etched material to be etched in the plasma was examined. Although the Si luminescence generally has wavelengths of 251 nm, 288 nm, etc., only the luminescence having a wavelength of 288 nm was measured. Although the W luminescence in general is widely distributed in a range of wavelengths of 400 to 600 nm, only the luminescence having the wavelength of 430 nm was measured.

Figure 9A:
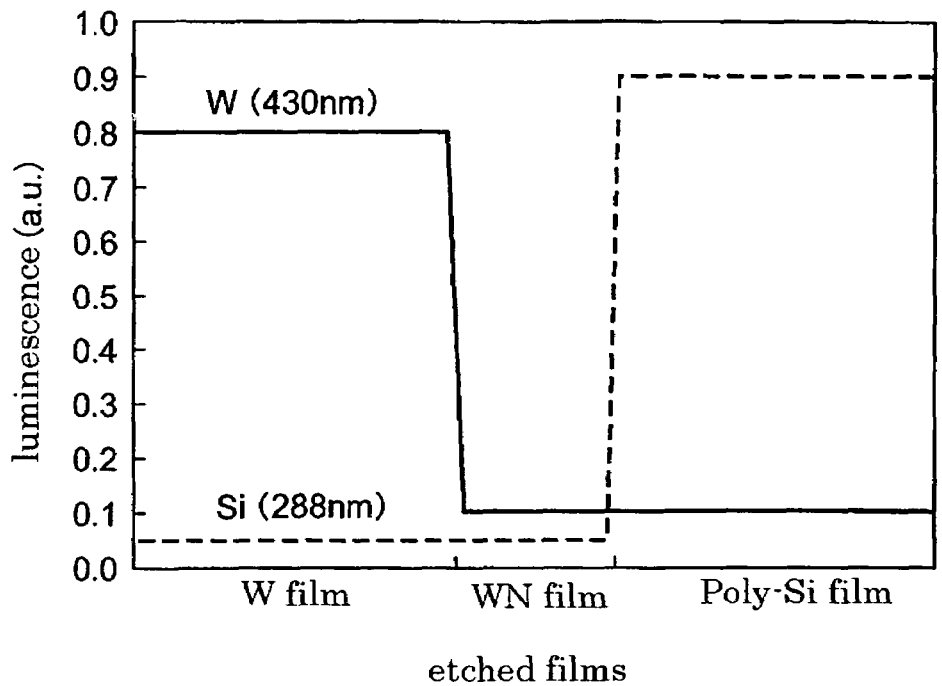
FIG. 9A is a graph showing the relationship between optical emission intensity and layer to be etched, obtained from an experiment-4.

The result is shown in FIG. 9A. The intensity of W luminescence was constant during the etching of the W layer 15, and when the etching of the W layer 15 was ended and the etching of the WN layer 14 was started, the intensity of the W luminescence was abruptly lowered. On the other hand, the intensity of Si luminescence was substantially constant during the etching of the W layer 15 and the WN layer 14, and when the etching of the WN layer 14 was ended and the etching of the Poly-Si layer 13 was started, the intensity of the Si luminescence was abruptly increased. Therefore, it was understood that the timing for removing the W layer 15 and starting to etch the WN layer 14 could be determined by the timing when the intensity of the W luminescence abruptly fell.

Figure 9B:
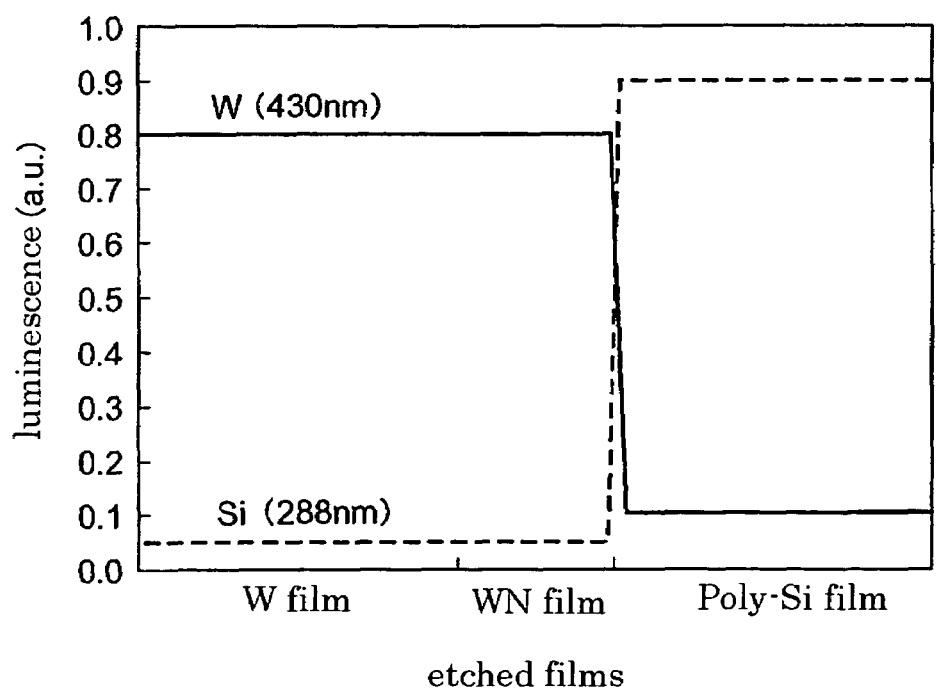
FIG. 9B is a graph showing the relationship between optical emission intensity and layer to be etched, obtained from a comparative example.

As a comparative example, the result of a similar experiment by using plasma in mixed gas of $CF_4$ and $N_2$ which cannot provide the high W/WN selectivity ratio is shown in FIG. 9B. In this case, the intensity of the W luminescence hardly changed at the W/WN boundary, and at the timing when the WN layer 14 was removed and the etching of the Poly-Si layer 13 was started, the intensity of the W luminescence was abruptly lowered. On the other hand, the Si luminescence was abruptly increased at the same time when the W luminescence was lowered. Therefore, in the dry etching using the plasma in mixed gas of $CF_4$ and $N_2$, it was found that the finishing of the etching of the W layer 15 could be effectively determined.

The present inventor decided, based on the findings in the experiment-4, to monitor the W luminescence for detecting the timing of shifting from the first step to the second step, and judge the removal of the W layer 15 at the timing when the intensity of the W luminescence abruptly falls. It is to be noted that, in this experiment, the W luminescence having the wavelength of 430 nm was used for shifting from the first step to the second step. However, a similar effect may be obtained using the W luminescence having a wavelength within the range of 400 to 600 nm. In addition to the plasma in mixed gas of $SF_6$ and $N_2$, any plasma in first etching gas, such as plasma in mixed gas of $NF_3$ and $N_2$, can provide a similar effect.

Embodiments of the present invention will now be described in more detail with reference to the accompanying drawings. FIGS. 1A to 1F are sectional views showing consecutive steps of a method for manufacturing a semiconductor device according to a first embodiment of the present invention. This embodiment is such that the present invention is applied to a method for forming a gate electrode structure in a process of manufacturing a DRAM.

Figure 1A:
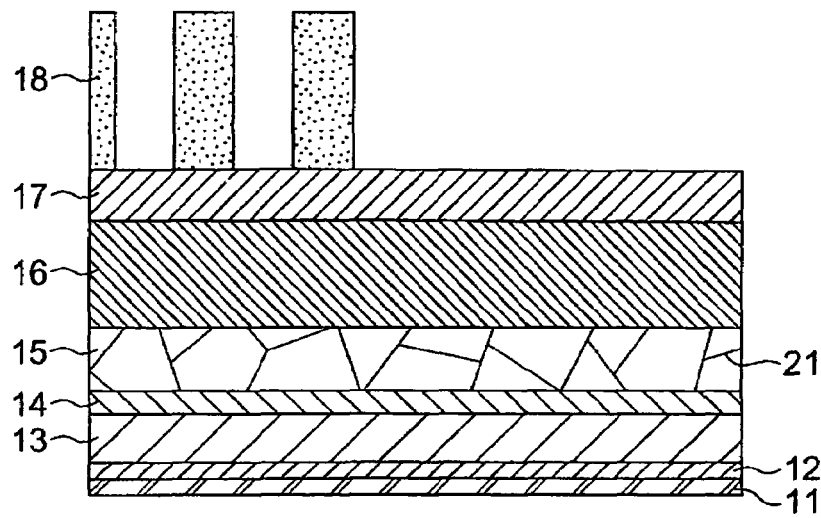
FIGS. 1A to 1F are sectional views showing consecutive steps of a method for manufacturing a semiconductor device according to a first embodiment of the present invention.

First, an ion implantation or the like is performed to a single-crystal silicon substrate 11, to thereby form source/drain diffused regions (not shown). Then, a gate oxide film 12 having a thickness of 4 nm, a polysilicon film 13 having a thickness of 70 nm, a WN film 14 having a thickness of 10 nm, a W film 15 having a thickness of 60 nm, a SiN film 16 having a thickness of 140 nm, and a $SiO_2$ film 17 having a thickness of 80 nm are consecutively formed on the single-crystal silicon substrate 11. Subsequently, a photoresist film is formed thereon, and a photoresist pattern 18 shown in FIG. 1A is formed by a photolithographic technique using a mask having thereon a gate electrode pattern.

Figure 1B:
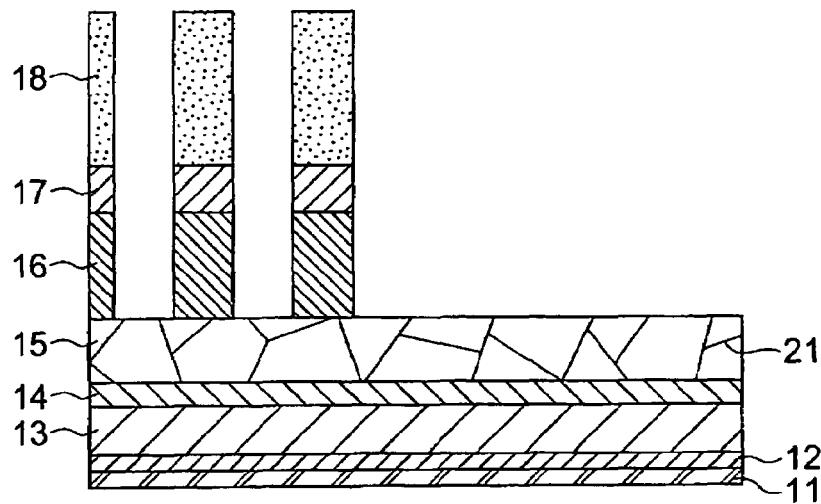
Figure 1C:
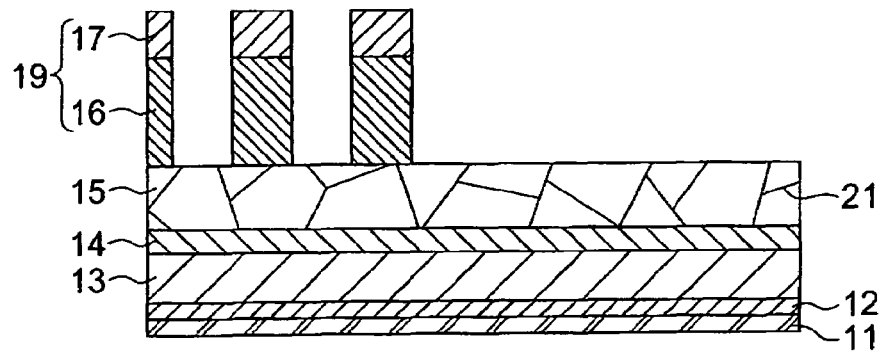

Then, the $SiO_2$ film 17 and the SiN film 16 are patterned by a dry etching technique using the photoresist pattern 18 as an etching mask, as shown in FIG. 1B. Subsequently, the photoresist pattern 18 is removed by a process using $O_2$ plasma and a chemical cleaning process, to form an insulating film mask 19 made of a layered film including the SiN film 16 and the $SiO_2$ layer 17 shown in FIG. 1C.

Then, the W film 15, the WN film 14 and the Poly-Si film 13 are patterned by a dry etching technique using a UHF-ECR (Ultra High Frequency Electron Cyclotron Resonance) plasma etching system.

Figure 1D:
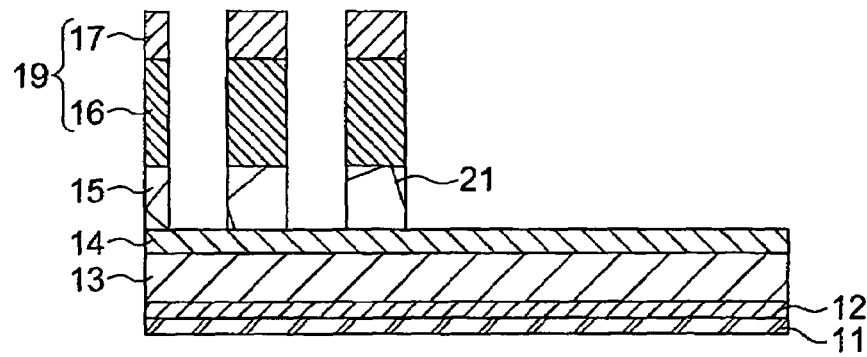

As the first step, the W film 15 is patterned as shown in FIG. 1D by a dry etching technique using the insulating film mask 19 as an etching mask. In the first step, plasma in mixed gas obtained by mixing $SF_6$, $N_2$ and $Cl_2$ at flow rates of 20 sccm, 80 sccm and 100 sccm, respectively, as the first etching gas is used. Since this mixed gas has a mixture ratio of 20% for $N_2$ to ($N_2$+$SF_6$), the mixed gas has a high W/WN selectivity ratio. $Cl_2$ is used to suppress the side etching of the W layer 15. For patterning the W layer 15, the timing when the luminescence intensity of the W luminescence having a wavelength of 430 nm abruptly falls is judged as a timing when the W layer 15 was removed, whereby the process shifts to the second step.

Figure 1E:
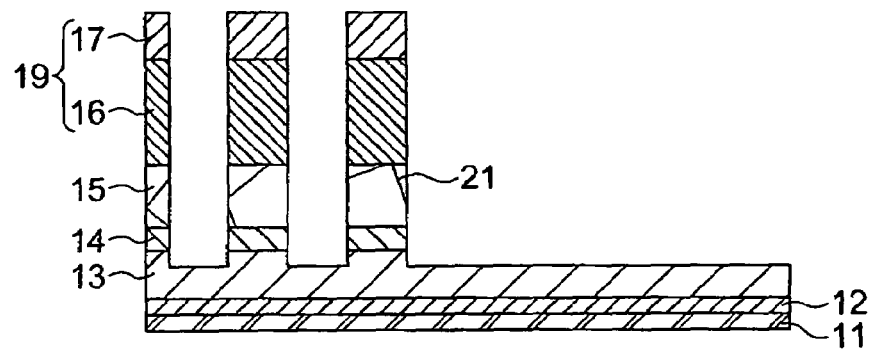
Figure 1F:
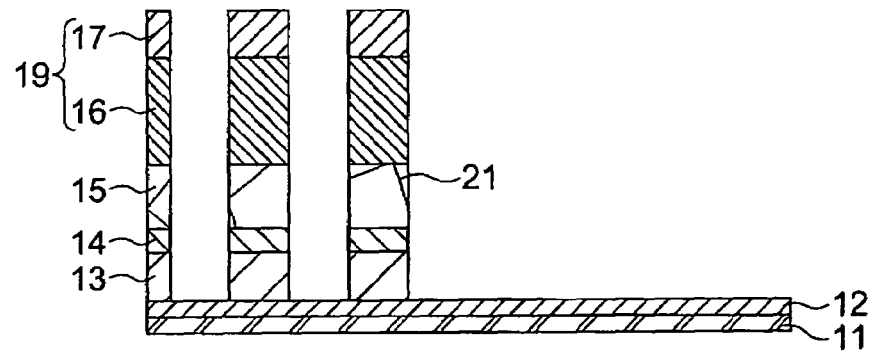

In the second step, both the WN layer 14 and the Poly-Si layer 13 are patterned as shown in FIG. 1E, by a dry etching technique using the insulating film mask 19 as an etching mask. In the second step, plasma in mixed gas obtained by mixing $CF_4$, $Cl_2$, $N_2$ and $O_2$ at flow rates of 30 sccm, 10 sccm, 100 sccm and 30 sccm, respectively, as the second etching gas is used. In this mixed gas, $CF_4$ is used to raise the selectivity ratio of WN/Poly-Si, $Cl_2$ is used to improve the etching speed, $N_2$ is used to suppress the side etching, and $O_2$ is used to improve the selectively ratio between the insulating film mask 19 and the Poly-Si layer 13. The process shifts to the third step before the Poly-Si layer 13 is completely removed.

In the third step, the residual Poly-Si film 13 is completely removed by an etching process using plasma in mixed gas of HBr and $O_2$ having a high Poly-Si/$SiO_2$ selectively ratio. Thus, a gate electrode shown in FIG. 1F can be formed.

According to the present embodiment, the etching depth difference due to coarse and fine pattern regions and the resultant unevenness of the etching surface in the vicinity of the W/WN boundary can be reduced by etching the W layer 15 while using plasma in first etching gas having a high W/WN selectivity ratio in the first step. Further, since the etching depth difference due to coarse and fine pattern regions and the unevenness of the etching surface are not enlarged during the etching of the WN layer 14 and the Poly-Si layer 13 by using plasma in second etching gas having a high WN/Poly-Si selectivity ratio in the second step, penetration of the $SiO_2$ layer of the recessed part in the coarse pattern region can be prevented in the third step. In addition, the timing when the W layer 15 is removed can be appropriately judged by monitoring the W luminescence.

According to the present embodiment, the time length for using plasma in fluorocarbon during etching the $SiO_2$ layer 17 configuring the upper part of the insulating film mask 19 is reduced as compared to the time length in the conventional technique for manufacturing a semiconductor device. Thus, the amount of the removed $SiO_2$ layer 17 can be reduced due to the improvement of the selectivity ratio against the $SiO_2$ layer 17. Further, since the side etching is suppressed by using $Cl_2$ in the first step, and also suppressed by using $N_2$ in the second step, the degree of the side surface of the patterned film to align with the vertical plane is improved as compared to the conventional method for manufacturing the semiconductor device. Furthermore, $Cl_2$ is used in the second step, and hence the etching speed in the second step can be improved. It should be also noted in the present embodiment that $NF_3$ may be used instead of $SF_6$ in the first step, or other fluorocarbon gas may be used instead of $CF_4$ in the second step.

Figure 2A:
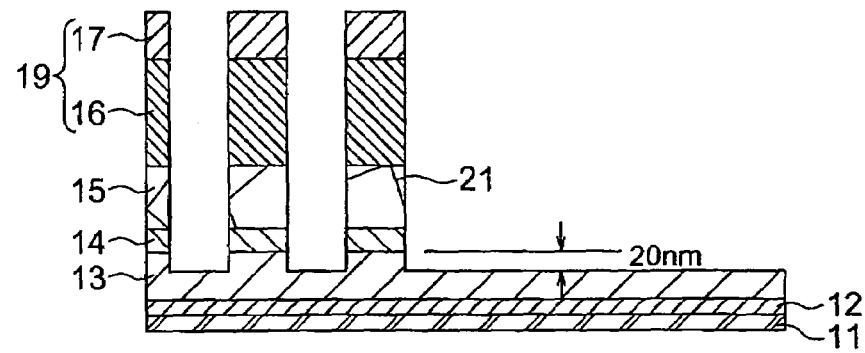
FIGS. 2A to 2C are sectional views showing consecutive steps of a method for manufacturing a semiconductor device according to a second embodiment of the present invention.
Figure 2B:
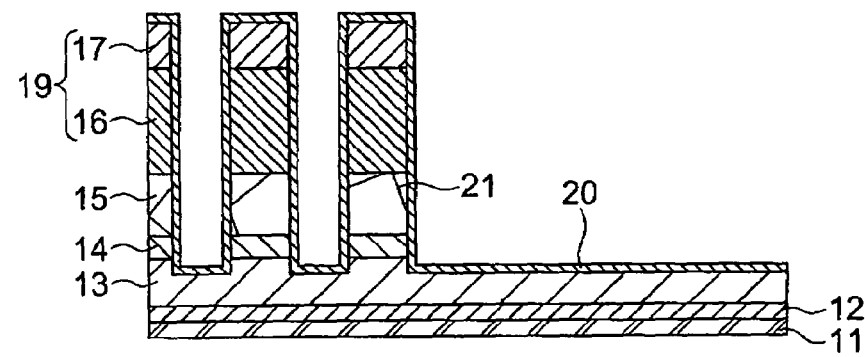
Figure 2C:
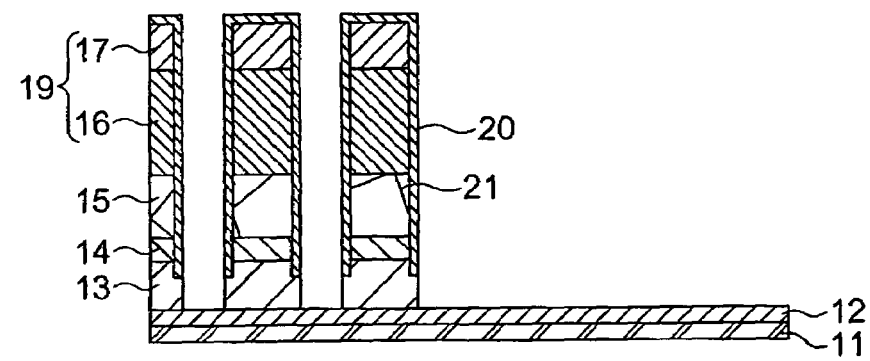
Figure 3:
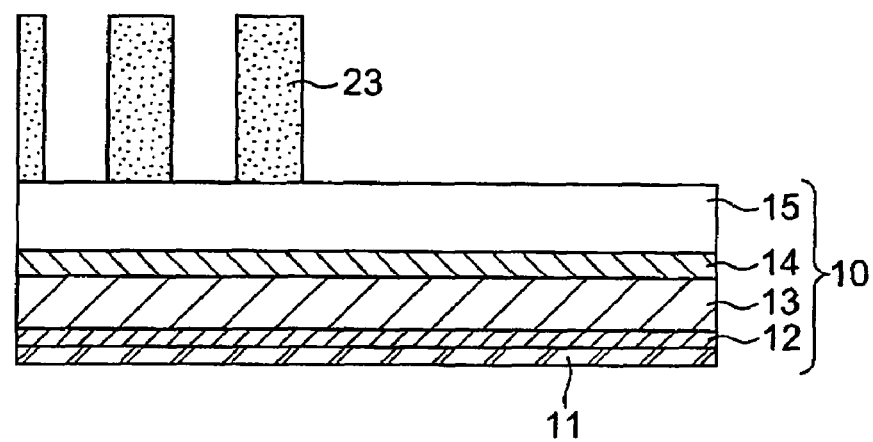
FIG. 3 is a sectional view showing a manufacturing step of a conventional method for manufacturing a semiconductor device.

FIGS. 2A to 2C show sectional views showing consecutive steps of a method for manufacturing a semiconductor device according to a second embodiment of the present invention. The present embodiment is an example in which the present invention is applied to a method for manufacturing a semiconductor device described in Jpn. Pat. Appln. Publication No. 2003-68878. The method for manufacturing the semiconductor device according to the present embodiment is similar to the method for manufacturing the semiconductor device according to the first embodiment up to the step of etching the WN layer 14. That is, the W layer 15 is etched under the plasma and etching conditions used in the first step of the first embodiment, following to the step shown in FIG. 1C. Then, the WN layer 14 is etched under the plasma and etching conditions used in the second step of the first embodiment.

Subsequent to the etching of the WN layer 14, the Poly-Si film 13 is etched by about 20 nm from the top surface of the Poly-Si film 13 as shown in FIG. 2A, under the plasma and etching conditions used in the second step of the first embodiment. Then, as shown in FIG. 2B, a SiN film 20 having a thickness of 13 nm is deposited on the entire surface to cover the side surface of the W layer 15 with the SIN film 20. Subsequently, the SiN film 20 is etched by using plasma in mixed gas containing $CF_4$. Then, the Poly-Si film 13 is etched by using plasma in mixed gas containing HBr and $O_2$, to thereby expose the $SiO_2$ layer 12. Thus, as shown in FIG. 2C, a gate electrode structure having W-containing layers (14, 15) covered with SiN (16, 20) and Poly-Si (13) can be obtained.

According to the second embodiment, since the etching depth difference caused by coarse and fine pattern regions and the resultant unevenness of the etching surface in the Poly-Si layer 13 are small at a stage shown in FIG. 2A, even when the SiN layer 20 and the Poly-Si layer 13 are etched, the etching depth difference and the resultant unevenness on the etching surface can be reduced. Thus, penetration of the $SiO_2$ layer 12 can be prevented.

Since the W layer 15 and WN layers 14 are covered with SiN layers (16, 20) and the Poly-Si layer (13), contamination of the $SiO_2$ layer 12 by W and the oxide thereof is reduced during etching these layers. Thus, the W and the oxide thereof are not diffused on the Si substrate 11, and an increase in the leakage current can be prevented.

The present invention has been described based on the preferred embodiments thereof. However, the method for manufacturing the semiconductor device according to the present invention is not limited only to the structure or process in the above-described embodiments, and various changes and modifications from the above-described embodiments can be made without departing from the scope of the present invention.

What is claimed is:

1. A method of manufacturing a semiconductor device comprising:
   consecutively depositing a silicon (Si) layer, a tungsten nitride (WN) layer, and a tungsten (W) layer on a silicon oxide layer;
   forming a mask pattern on said W layer;
   selectively etching said W layer by using plasma generated in a first etching gas having a high W/WN etch selectivity ratio and using said mask pattern as an etching mask;
   selectively etching said WN layer and said Si layer by using plasma generated in a second etching gas having a high WN/Si etch selectivity ratio and using said mask pattern as an etching mask; and
   selectively etching said Si layer by using plasma generated in a third etching gas having a high $Si/SiO_2$ etch selectivity ratio and using said mask pattern as an etching mask.

2. The method according to claim 1, wherein said second gas includes fluorocarbon.

3. The method according to claim 1, wherein said first etching gas includes at least one of $SF_6$ and $NF_3$, and $N_2$ without including fluorocarbon.

4. The method according to claim 3, wherein said second gas includes fluorocarbon.

5. The method according to claim 4, wherein said second etching gas includes at least one gas selected from the group consisting of $CHF_3$, $CH_2F_2$, $CH_3F$, $C_2F_6$, $C_3F_6$, $C_4F_6$ and $C_4F_8$.

6. The method according to claim 1, wherein said selectively etching said W layer is finished at a timing when a W luminescence at a wavelength of reaction product of W abruptly falls in a spectrum analysis of said plasma in said etching gas.

7. The method according to claim 6, wherein said wavelength is between 400 nm and 600 nm.

8. The method according to claim 1, further comprising depositing a SiN film to cover exposed surfaces between said selectively etching said W layer and said selectively etching said Si layer.

9. The method according to claim 1, wherein said first etching gas is devoid of fluorocarbon.

10. The method according to claim 1, wherein said first etching gas comprises a mixture of $SF_6$, $Cl_2$, and $N_2$.

11. The method according to claim 1, wherein said first etching gas comprises a gas mixture having a mixture ratio of 20% for $N_2$ to ($N_2$+$SF_6$).

12. The method according to claim 1, wherein said second etching gases comprises at least one gas selected from the group consisting of $CHF_3$, $CH_2F_2$, $CH_3F$, $C_2F_6$, $C_3F_6$, $C_4F_6$ and $C_4F_8$, mixed with $Cl_2$, $O_2$, and $N_2$.

13. The method according to claim 1, wherein said second etching gases comprises a mixture of $CF_4$, mixed with $Cl_2$, $O_2$, and $N_2$.

14. The method according to claim 1, wherein said third etching gas comprises a mixture of HBr and $O_2$.

15. A method of manufacturing a semiconductor device comprising:
   depositing a silicon layer, a tungsten nitride layer, and a tungsten layer on a base layer;
   selectively etching said tungsten layer by using plasma generated in a first etching gas;
   selectively etching said tungsten nitride layer and said silicon layer by using plasma generated in a second etching gas; and
   selectively etching said silicon layer by using plasma generated in a third etching gas.

16. A method of manufacturing a semiconductor device comprising:
   depositing a silicon layer, a tungsten nitride layer, and a tungsten layer on a base layer;
   selectively etching said tungsten layer by using plasma generated in a first etching gas having a high W/WN etch selectivity ratio;
   selectively etching said tungsten nitride layer and said silicon layer by using plasma generated in a second etching gas having a high WN/Si etch selectivity ratio; and
   selectively etching said silicon layer by using plasma generated in a third etching gas having a high $Si/SiO_2$ etch selectivity ratio.

* * * * *